United States Patent

Warren

[15] 3,676,699

[45] July 11, 1972

[54] ASYNCHRONOUS PULSE WIDTH FILTER

[72] Inventor: Samuel C. Warren, Indianapolis, Ind.

[73] Assignee: The United States of America as represented by the Secretary of the Navy

[22] Filed: Sept. 13, 1971

[21] Appl. No.: 179,865

[52] U.S. Cl. ..............................307/234, 307/273, 328/112, 328/164, 328/167

[51] Int. Cl. ..........................................................H03k 5/20

[58] Field of Search ..................328/110, 111, 112, 164, 165, 328/166, 167; 307/234, 260, 273

[56] References Cited

UNITED STATES PATENTS

| | | | |
|---|---|---|---|
| 3,226,577 | 12/1965 | Azuma et al. | 307/234 |
| 3,555,434 | 1/1971 | Sheen | 307/234 X |
| 3,576,496 | 4/1971 | Garagnon | 307/273 X |

*Primary Examiner*—Donald D. Forrer
*Assistant Examiner*—R. C. Woodbridge
*Attorney*—R. S. Sciascia et al.

[57] ABSTRACT

An asynchronous pulse width filter having four two-state logic circuits, the first having a retriggerable circuit capable of delaying the leading edge of an input pulse by a presettable time $\Delta t$, coupled to a second logic circuit capable of detecting the trailing edge of the input pulse after the delayed leading edge, coupled to a third logic circuit of non-retriggerable capabilities but capable of delaying the trailing edge from the prior logic circuit a fixed amount of time $\Delta t$ and coupled to a fourth logic circuit capable of triggering a leading edge at the trailing edge of the output pulse of the second logic circuit and of triggering a trailing edge at the trailing edge of the delayed output $\Delta t$ of the third logic circuit to provide discrimination of pulse width to reproduce valid pulses precisely in pulse width and in relative position.

4 Claims, 3 Drawing Figures

PATENTED JUL 11 1972

3,676,699

ASYNCHRONOUS PULSE WIDTH FILTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to pulse width selecting filters and more particularly to a circuit capable of filtering out pulses of pulse width less than a predetermined or preset pulse width and passing output pulses of original width and in the same relative position for input pulses of equal or greater pulse width than the predetermined or preset pulse width.

Prior known pulse width selecting filters utilize a series of delay lines to delay and analyze pulse width in analog voltages. Such systems lose accuracy with time and temperature changes producing deviations from the desired pulse width selection.

SUMMARY OF THE INVENTION

This invention provides an electronic filter capable of pulse discrimination on the basis of pulse width. The circuit device of this invention will block all pulses in an incident series of positive going pulses that have a pulse width less than a presettable minimum value, such as $\Delta t$. Those pulses of the series that are passed by the electronic filter must have a pulse width greater than $\Delta t$. The passed pulses will appear at the output of the filter with unmodified pulse width and relative position. The passed portion of the incident pulse series will be delayed in time by an amount $\Delta t$, the presettable minimum pulse width value. This pulse width discrimination is accomplished through the use of a combination of four stages of retriggerable and non-retriggerable multivibrators and flip-flops coupled in series-parallel relation providing digital sequences of pulses with predetermined delays. It is accordingly a general object of this invention to provide an asynchronous pulse width electronic filter capable of rejecting all pulses in an incident series of lesser pulse width than a preset pulse width and of passing, unmodified in pulse width and relative position, pulses of a width greater than the preset pulse width.

BRIEF DESCRIPTION OF THE DRAWING

These and other objects and the attendant advantages, features and uses of the invention will become more apparent to those skilled in the art as a more detailed description proceeds when considered along with the accompanying drawing in which.

DESCRIPTION OF THE PREFERRED EMBODIMENT

Figure 1:
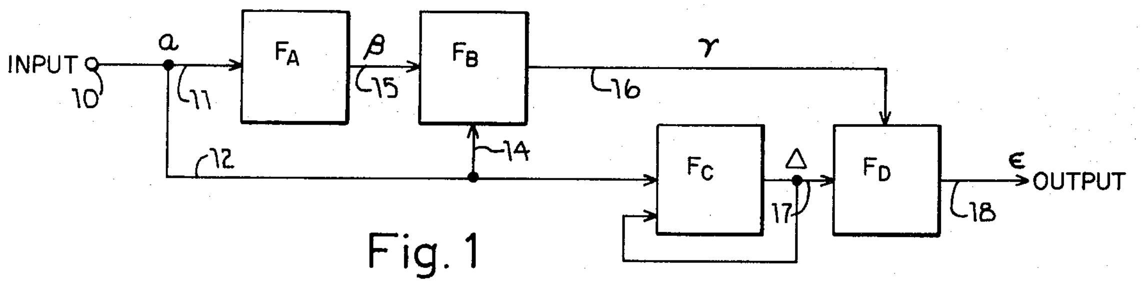
FIG. 1 is a block circuit schematic showing the components included in the invention.
Figure 2:
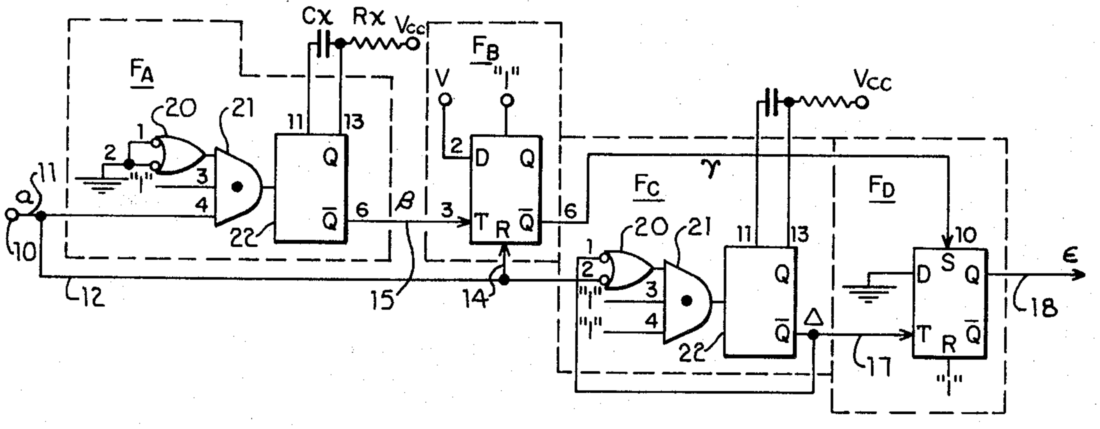
FIG. 2 is a block circuit schematic showing a breakdown block diagram of each of the blocks of FIG. 1 as they are prepared in integrated circuits.
Figure 3:
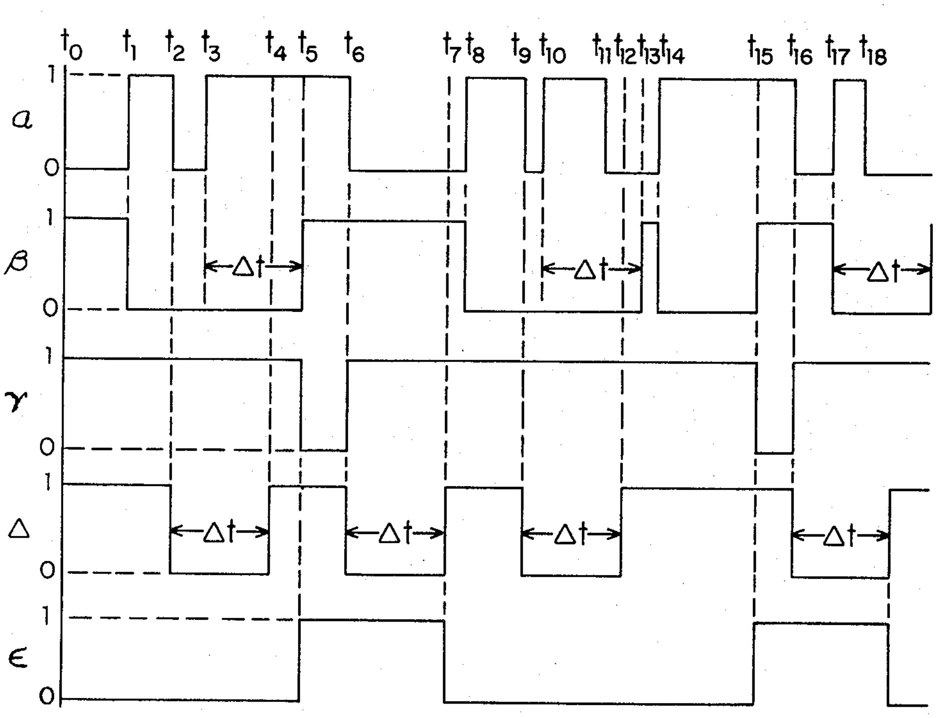
FIG. 3 illustrates a series of related waveforms as they occur on the several inputs and outputs shown in FIGS. 1 and 2.

Referring more particularly to FIG. 1 with occasional reference to FIG. 3, the asynchronous pulse width filter consists of four logic circuits of two-state binary functions consisting of a combination multivibrator and flip-flop circuits, to accomplish pulse width discrimination. An input of random width pulses may be applied to terminal 10, such as pulses $\alpha$ illustrated in the top line of FIG. 3. The input of random width pulses $\alpha$ are applied by way of conductor 11 to a first logic circuit $F_A$, to a second logic circuit $F_B$ by way of conductors 12 and 14, and to a third logic circuit $F_C$ by way of conductor 12. The logic circuit $F_A$ will produce an output on the conductor 15 of pulses $\beta$ shown in the second line of FIG. 3. The logic circuit $F_B$ will produce on its output 16 the pulses $\gamma$, as shown by the third line of FIG. 3. Logic circuit $F_C$ produces on its output 17 the pulses $\Delta$, as shown in the fourth line of FIG. 3, the $\gamma$ and $\Delta$ outputs on the conductors 16 and 17 both being applied to a fourth logic circuit $F_D$ to produce on its output 18 the delayed and filtered pulses $\epsilon$ as shown in the fifth line of FIG. 3, the development of these pulses being accomplished as will hereinafter be made clear in the description of FIG. 2.

Referring more particularly to FIG. 2 the logic circuit $F_A$ is an integrated circuit (IC) that can be, from a functional standpoint, any retriggerable arrangement of circuitry capable of delaying the leading edge of input pulses $\alpha$ by a presettable amount of time which will hereinafter be referred to as the time $\Delta t$. The logic circuit $F_A$ is shown in its component parts as originally used in a developmental model as a Fairchild retriggerable monostable multivibrator No. 9601 although ICs or microcircuits of other known types and makes may be utilized. The IC $F_A$ used herein consists of an OR gate 20 having inverting inputs thereto with the output thereof coupled as one input to an AND gate 21, the output of which AND gate is coupled as an input to a multivibrator 22 having outputs Q and $\overline{Q}$. The multivibrator 22 has an RC timing network external to the IC coupled to terminals 11 and 13 from a voltage source *Vcc* through a resistor $R_x$ and capacitor $C_x$. Whenever the multivibrator 22 is triggered with a binary "1" ! input, it will remain in its changed state, as where the Q output goes from "0" to "1," for a time determined by the $R_xC_x$ time constant for the capacitor $C_x$ to charge at which time the Q output will return to "0." Terminals 1 and 2 of the inverted input OR gate 20 are coupled in common to ground which will produce a continuous binary "1" output as one input to the AND gate 21. The input terminal 3 to AND gate 21 has a voltage standing thereon representative of a binary "1" input and the fourth terminal of AND gate 21 is coupled to terminal 10 through the conductor 11 to which the random width $\alpha$ pulses are applied. This arrangement of $F_A$ provides a retriggerable monostable multivibrator which can be made to trigger on only a positive-going edge, such as a binary transition from "0" to "1" by making the trigger pulse input on either of the AND gate inputs 3 or 4. By this arrangement the multivibrator 22 is triggered only when the AND gate 21 input thereto goes from a "0" to "1" state. The $R_xC_x$ timing circuit is preset by the values of these elements to delay the leading edge of the input pulse $\alpha$ by an amount $\Delta t$. As noted in FIG. 3, $F_A$ will be triggered at $t_1$, $t_3$, $t_8$, $t_{10}$, $t_{15}$, and $t_{17}$. The output $\beta$ of $F_A$ is a negative-going pulse, or binary "1" to "0" to "1," with the leading edge synchronous within the propagation delay with the delayed leading edge of $\alpha$. The trailing edge of $\beta$ is the delayed leading edge of $\alpha$ providing a "0" to "1" transition, delayed by the amount of $\Delta t$. The $R_xC_x$ time control circuit controlling the magnitude of $\Delta t$ has the approximate relationship as, $\Delta t \approx .36\, R_xC_x$. Accordingly, as the input of $\alpha$ pulses are applied to the IC $F_A$, only $\beta$ pulses will be produced where the width of the $\alpha$ pulse is greater than $\Delta t$. As may be seen in FIG. 3, the first $\alpha$ pulse triggered $F_A$ at $t_1$ and since this $\alpha$ pulse was of short duration, $t_1$ to $t_2$, $F_A$ retriggered again at $t_3$ to produce the $\Delta t$ delay in the $\beta$ pulse ending at time $t_5$ whereas the $\alpha$ pulse continued in time to $t_6$.

The $\beta$ output pulses of $F_A$ are applied to $F_B$ which is an IC used herein and identified by a Motorola type "D" flip-flop No. MC 3060, although other IC or microcircuits having the capabilities of this IC may be used wherever desired. In this IC $F_B$ a voltage representative of a binary "1" is applied to the D terminal and to the S terminal while the input of $\beta$ pulses are applied to the T clock terminal and the $\alpha$ pulses are applied to the R terminal. The output conductor 16 is taken from the $\overline{Q}$ terminal on which the $\gamma$ pulses of FIG. 3 are developed. The terminal Q is open ended and the complement of Q is produced on the $\overline{Q}$ output, as well understood by those skilled in the art. $F_B$ will shift only when the input state at T changes from the "0" state to the "1" state and both S and R inputs are held at the "1" state during the transition. The S input is the asynchronous SET input. Similarly the R input is the asynchronous RESET input. A "0" state at the S input will unconditionally cause the Q output to be at a "1" state and/or a "0" state at the R input will unconditionally cause the Q output to be a "1" state. The $\beta$ input at the T terminal operates as the clock input and $\alpha$ is applied to the R terminal or the asynchronous RESET INPUT. Since the terminals D and S inputs are always at the "1" state, it should be apparent that the $\bar{Q}$ output of $F_B$ can be shifted to the "0" state only when the trailing edge of $\beta$, or "0" to "1" transition occurs while $\alpha$ is at a high or "1" state. Since $F_A$ is a retriggerable function, $\bar{Q}$ of $F_B$ can be changed to "0" only by a valid pulse in which the pulse width of $\alpha$ is greater than $\Delta t$; therefore the last $\alpha$ pulse to trigger $F_A$ is still in the high state when the trailing edge of $\beta$ occurs and $\bar{Q}$ output of $F_B$ will be shifted to the "0" state by the trailing edge of $\beta$. It should be equally apparent from the preceding statements that if the pulse width of $\alpha$ is less than $\Delta t$, $\alpha$ will cause no change to occur at the $\bar{Q}$ output of $F_B$ since the trailing edge of $\beta$ will occur after the trailing edge of $\alpha$ and the R input to $F_B$ will be changed to "0" state. This input condition, as previously mentioned, unconditionally maintains the $\bar{Q}$ output of $F_B$ at the "1" state. Accordingly, $\gamma$ as shown in FIG. 3 will be reproduced on the output 16 of $F_B$ in a time sequence as shown in FIG. 3 with respect to the input pulse $\alpha$ and the delayed pulse $\beta$.

The IC $F_C$ may be of a type marketed by Fairchild as a retriggerable monostable multivibrator No. 9601, quite the same as used for $F_A$ although as hereinbefore stated other IC known to have the characteristics and capabilities of this IC may be used wherever desired. The monostable multivibrator circuit $F_C$ is made non-retriggerable by coupling the $\bar{Q}$ output from the multivibrator 22 back to terminal 1 of the inverted input OR gate 20. The input of $\alpha$ pulses from terminal 10 is coupled by the branch conductor 12 to the inverted input terminal 2 of OR gate 20. Terminals 3 and 4 of AND gate 21 are coupled to a voltage source providing a "1" state on these inputs. The $R_xC_x$ timing network, coupled external to the IC, is the same as the $R_xC_x$ timing network of $F_A$ to time the period that the Q output remains in its "1" state after being triggered thereto by an input pulse, being a random pulse $\alpha$. Since the input terminal 2 to OR gate 20 is through an inverter, the trailing edge of $\alpha$ will trigger the multivibrator 22 when $\alpha$ goes from "1" to "0" if the non-retriggerable inverted input to terminal 1 of OR gate 20 is in the "1" or high state. Since a "0" state input to an inverted input OR gate makes its output assume unconditionally a "1" state, the trailing edge of $\alpha$ can initially trigger $F_C$ causing the $\bar{Q}$ output to go to a "0" state and there remain for a period $\Delta t$ after which a new trailing edge cannot be passed through the OR gate, thus preventing retriggerable operation. The $\bar{Q}$ output of $F_C$ once triggered to the "0" state will so remain, as in the case of $F_A$, until the interval of time $\Delta t$ has gone by at which time the $\bar{Q}$ output returns to the "1" state and the function can once again be triggered. The output $\bar{Q}$ on the conductor 17 is illustrated by $\Delta$ in FIG. 3 which will be produced at times $t_2$, $t_6$, $t_9$, and $t_{16}$.

The IC $F_D$ is of the same type of flip-flop as the IC $F_B$ although in $F_D$ the D input is grounded, the S input is coupled to conductor 16 over which the $\gamma$ pulses from $F_B$ are conducted, the $\bar{Q}$ output is opened ended and the output 18 is taken from the Q output over which pulses $\epsilon$ of FIG. 3 are conducted. In the multivibrator $F_D$ the shift can only occur when the input state at terminal T changes from the "0" state to the "1" state and both S and R inputs are held at the "1" states during the clock transition at input T. The S input is the asynchronous SET input. A "0" state at this input will unconditionally cause the Q output to be at a "1" state. Similarly the R input is the asynchronous RESET input. A "0" state at this input will unconditionally cause the Q output to be at a "1" state. When a $\gamma$ pulse occurs, its leading edge (1 to 0) corresponds to the delayed leading edge of a valid $\alpha$ pulse, remembering that a valid $\alpha$ pulse is one in which the pulse width is greater than $\Delta t$. Since $\gamma$ is a "1" – "0" –"1" or negative-going pulse and its input is to the S terminal of $F_D$, the Q output of $F_D$ will change from the "0" state to a "1" state synchronously with the leading edge of $\gamma$ and therefore with the delayed leading edge of the corresponding valid $\alpha$ pulse. At this point the operation of the asynchronous pulse width filter on the leading edge of the valid $\alpha$ pulse is complete since the leading edge has been passed to the output 18 delayed by $\Delta t$. It remains only to return the Q output of $F_D$ to a "0" state at the proper time so that the asynchronous pulse width filter output $\epsilon$ on conductor 18 will correspond to the incident valid $\alpha$ pulse unchanged in pulse width. This is accomplished when the $\Delta$ pulse trailing edge, which is synchronous with the delayed trailing edge of the valid $\alpha$ pulse, occurs at the clock input T of $F_D$. This "0" to "1" transition shifts the "0" state at the D input to the Q output thus completing the asynchronous pulse width filter operation on the valid $\alpha$ pulse trailing edges. Accordingly, the output pulses $\epsilon$ will occur as shown following the valid $\alpha$ pulses in FIG. 3.

OPERATION

In the operation of the asynchronous pulse width filter with reference primarily to FIGS. 2 and 3, the leading edge of an input pulse $\alpha$ is delayed by an amount of time $\Delta t$, the minimum value of pulse width that will pass through the filter. If the delayed leading edge occurs in the time interval defined by the input pulse $\alpha$, then the pulse width of $\alpha$ must be greater than the time $\Delta t$ and the filter shifts the delayed leading edge to the output which goes high or to the "1" state as shown by the waveform $\epsilon$. If the delayed leading edge occurs after the trailing edge of $\alpha$ and therefore outside the time interval defined by $\Delta t$, then the pulse width of $\alpha$ must be less than the time $\Delta t$ and the filter will block the delayed leading edge and the output of $\epsilon$ will stay low. The operation of the filter on the leading edge of an input pulse $\alpha$ is retriggerable which means that filter is operating on the leading edge of one pulse and a second pulse occurs within an interval of time $\Delta t$ after the leading edge of the first, then the filter will instantly stop delaying the first leading edge and start delaying the second leading edge of $\alpha$. This effectively blocks the first leading edge for which there is no corresponding output response. Retriggering of the leading edge operation is essential to the proper function of the filter since the first pulse is necessarily less than $\Delta t$ in width and therefore it must be blocked. The trailing edge of an input pulse $\alpha$ is also delayed by an amount of time $\Delta t$ and this delayed edge is then shifted to the output as shown in FIG. 3. If the output state of $\epsilon$ is initially low, i.e., the leading edge operation blocked the corresponding leading edge of $\alpha$ because the pulse width of $\alpha$ is less than $\Delta t$, then the output of $\epsilon$ remains low. If the output state of $\epsilon$ is initially high, that is, the leading edge operation passed the corresponding leading edge because the pulse width of $\alpha$ was greater than $\Delta t$, the output of $\epsilon$ is changed to the low state by the delayed trailing edge of $\alpha$ being shifted to the output. The operation of the filter on the trailing edge of an input pulse $\alpha$ is not retriggerable. This means that if the filter is operating on the trailing edge of one pulse and a second pulse occurs with a trailing edge that falls within the interval $\Delta t$ after the trailing edge of the first pulse, the filter in $F_C$ ignores the trailing edge of the second pulse and continues to delay the trailing edge of the first pulse by an amount of time $\Delta t$. It should be apparent that if two or more trailing edges occur in the same interval of time $\Delta t$ only the first in time trailing edge can possibly belong to a pulse width of $\alpha$ greater than $\Delta t$. Accordingly, the asynchronous pulse width filter shown in FIGS. 1 and 2 will filter out all $\alpha$ pulses of a width less than $\Delta t$ and will pass valid $\alpha$ pulses of a width greater than $\Delta t$ to the output 18 as the pulse $\epsilon$ delayed in time but reproduced precisely in width with the valid $\alpha$ pulses.

While many modifications may be made in the structure of the invention by use of different flatpacs to accomplish the same results, applicant desires to be limited in his invention only by the scope of appended claims.

I claim:

1. An asynchronous pulse width filter circuit comprising: an input of random width pulses;

a first retriggerable multivibrator having an input coupled to said input of random pulses, having a delay network capable of delaying the leading edges of input pulses by a predetermined amount, and having an output for passing selected pulses of width equal to and greater than the predetermined amount;

a first flip-flop circuit having inputs coupled to said input of random width pulses and to said output of said first multivibrator to trigger a pulse at the delayed leading edge of the selected pulses from said first multivibrator terminating in a trailing edge at the trailing edge of the selected pulse from said input of random width pulses on an output thereof;

a second non-retriggerable multivibrator having an input coupled to the input of said random pulses and having a delay network capable of delaying the trailing edge on the output of said first flip-flop circuit on an output thereof said predetermined amount; and a second flip-flop circuit having one input coupled to the output of said second multivibrator and one input coupled to the output of said first flip-flop circuit to produce a pulse on an output thereof with a leading edge coinciding in time with the first delayed leading edge of the selected pulse output of said first multivibrator and with a trailing edge coinciding in time with the trailing edge of the selecting pulse with said second delay on the output of said second multivibrator whereby valid pulses of greater width than the width produced by said predetermined time delay will be passed through said two multivibrators and two flip-flops with the same pulse width and in the same time relations as corresponding selected pulses on said input of random pulses.

2. An asynchronous pulse width filter circuit as set forth in claim 1 wherein said delay networks of said first retriggerable and said second non-retriggerable multivibrators are resistance-capacitance networks of values to establish the same said predetermined delay in time.

3. An asynchronous pulse width filter circuit as set forth in claim 2 wherein said inputs to said first retriggerable and second non-retriggerable multivibrators each include an inverted input OR gate and an AND gate in which the input of random width pulses is applied to the AND gate of said first retriggerable multivibrator and to the inverted input OR gate of said second non-retriggerable multivibrator, the inverted inputs of the OR gate of said first multivibrator being grounded and the remaining inputs to the AND gate of said second multivibrator being fixed to a "1" state.

4. An asynchronous pulse width filter circuit as set forth in claim 3 wherein said inverted input OR gate in the input of said second multivibrator has one input fed back from the second multivibrator output to prevent said second multivibrator from retriggering at the trailing edges of each random width pulse whereby triggering is accomplished for said selected pulses.

* * * * *